US010032495B2

(12) United States Patent
Kim

(10) Patent No.: US 10,032,495 B2
(45) Date of Patent: Jul. 24, 2018

(54) BITLINE SENSEAMPLIFIER AND SEMICONDUCTOR MEMORY APPARATUS USING THE SAME

(71) Applicant: SK hynix Inc., Gyeonggi-do (KR)

(72) Inventor: Hee Sang Kim, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 30 days.

(21) Appl. No.: 15/478,730

(22) Filed: Apr. 4, 2017

(65) Prior Publication Data
US 2017/0206943 A1 Jul. 20, 2017

Related U.S. Application Data

(62) Division of application No. 14/946,959, filed on Nov. 20, 2015, now Pat. No. 9,646,659.

(30) Foreign Application Priority Data

Jul. 17, 2015 (KR) .................. 10-2015-0101780

(51) Int. Cl.
G11C 7/00 (2006.01)
G11C 7/12 (2006.01)
G11C 7/06 (2006.01)
G11C 5/14 (2006.01)
G11C 7/08 (2006.01)

(52) U.S. Cl.
CPC .............. G11C 7/12 (2013.01); G11C 5/14 (2013.01); G11C 7/06 (2013.01); G11C 7/065 (2013.01); G11C 7/08 (2013.01)

(58) Field of Classification Search
CPC .. G11C 7/06; G11C 7/062; G11C 7/08; G11C 7/1048; G11C 7/12
USPC ......................................... 365/196, 207, 226
See application file for complete search history.

(56) References Cited

U.S. PATENT DOCUMENTS

| 5,815,451 A * | 9/1998 | Tsuchida ............. G11C 11/4094 365/149 |
| 6,034,884 A | 3/2000 | Jung |
| 2010/0238749 A1 | 9/2010 | Kushida |
| 2011/0044121 A1* | 2/2011 | Kim ..................... G11C 11/4091 365/207 |
| 2011/0075498 A1* | 3/2011 | Song ...................... G11C 29/12 365/201 |

OTHER PUBLICATIONS

Notice of Allowance issued by the United States Patent and Trademark Office for U.S. Appl. No. 15/478,799 dated Aug. 21, 2017.

* cited by examiner

Primary Examiner — Han Yang
(74) Attorney, Agent, or Firm — IP & T Group LLP

(57) ABSTRACT

A memory apparatus may include a bit line sense-amplifier coupled to first and second bit lines; a first precharge unit suitable for coupling the first and second bit lines in response to a bit line equalization signal; a sense-amplifier power control unit suitable for providing a plurality of powers to the bit line sense-amplifier in response to a power control signal; and a second precharge unit suitable for individually changing each voltage level of the first and second bit lines based on a precharge control signal.

6 Claims, 9 Drawing Sheets

US 10,032,495 B2

BITLINE SENSEAMPLIFIER AND SEMICONDUCTOR MEMORY APPARATUS USING THE SAME

CROSS-REFERENCES TO RELATED APPLICATION

This application is a division of U.S. patent application Ser. No. 14/946,959, filed on Nov. 20, 2015, which claims priority under 35 U.S.C. § 119(a) to Korean application number 10-2015-0101780, filed on Jul. 17, 2015, in the Korean Intellectual Property Office. The disclosure of each of the foregoing application is incorporated herein by reference in its entirety.

BACKGROUND

1. Technical Field

Various embodiments relate to a semiconductor apparatus, and more particularly, to a memory apparatus and a bit line sense-amplifier.

2. Related Art

In generals a semiconductor apparatus is manufactured by forming a semiconductor device such as a MOS transistor on a substrate. As the semiconductor apparatus becomes integrated and smaller it is hard to control a process defining a characteristic of the MOS transistor and thus performance of the MOS transistor widely fluctuates according to process skew and PVT (Process, Voltage, Temperature) variations. Particularly, a process skew may occur among the MOS transistors concurrently manufactured on the same wafer under the same circumstance.

As research and development of a semiconductor apparatus focuses on reducing the power consumption, the semiconductor apparatus is supposed to precisely process signals of smaller amplitude. However, the process skew or offset decreases reliability of the semiconductor apparatus. For example, mismatch among transistors forming a latch circuit may cause the latch circuit incapable of detecting a small signal. Therefore, various studies focus on compensating the mismatch among the MOS transistors.

SUMMARY

Various embodiments provided to a bit line sense-amplifier capable of performing precharge operation for compensating a mismatch among transistors in order to perform precise sensing and amplifying operation, and a memory apparatus using the same.

In an embodiment of the present invention, a memory apparatus may include: a bit line sense-amplifier coupled to first and second bit lines; a first precharge unit suitable for coupling the first and second bit lines in response to a bit line equalization signal; a sense-amplifier power control unit suitable for providing a plurality of powers to the bit line sense-amplifier in response to a power control signal; and a second precharge unit suitable for individually changing each voltage level of the first and second bit lines based on a precharge control signal.

In an embodiment of the present invention, a memory apparatus may include: a bit line sense-amplifier coupled to first and second bit lines; a first precharge unit suitable for coupling the first and second bit lines in response to a bit line equalization signal; a sense-amplifier power control unit suitable for providing a plurality of powers to the bit line sense-amplifier in response to a power control signal; a second precharge unit suitable for providing a first precharge voltage to the first and second bit lines in response to the bit line equalization signal; and a third precharge unit suitable for individually changing each voltage level of the first and second bit lines by providing a second precharge voltage to the first and second bit lines in response to a bit line precharge control signal.

In an embodiment of the present invention, memory apparatus may include: a bit line sense-amplifier including a plurality of cross-coupled transistors, a first input node coupled to a first bit line, and a second input node coupled to a second bit line; a first precharge unit suitable for coupling the first and second bit lines in response to a bit line equalization signal; a sense-amplifier power control unit suitable for selectively providing a plurality of powers to the bit line sense-amplifier in response to a power control signal; a second precharge unit suitable for providing one of first and second precharge voltages to the bit line sense-amplifier in response to a precharge voltage selection signal and a first precharge control signal; and a third precharge unit suitable for decoupling gates of the plurality of transistors and the first and second input nodes in response to a second precharge control signal.

BRIEF DESCRIPTION OF THE DRAWINGS

Features, aspects and embodiments are described in conjunction with the attached drawings, in which.

DETAILED DESCRIPTION

Hereinafter, a semiconductor apparatus according to the present invention will be described below with reference to the accompanying drawings through embodiments.

Figure 1:
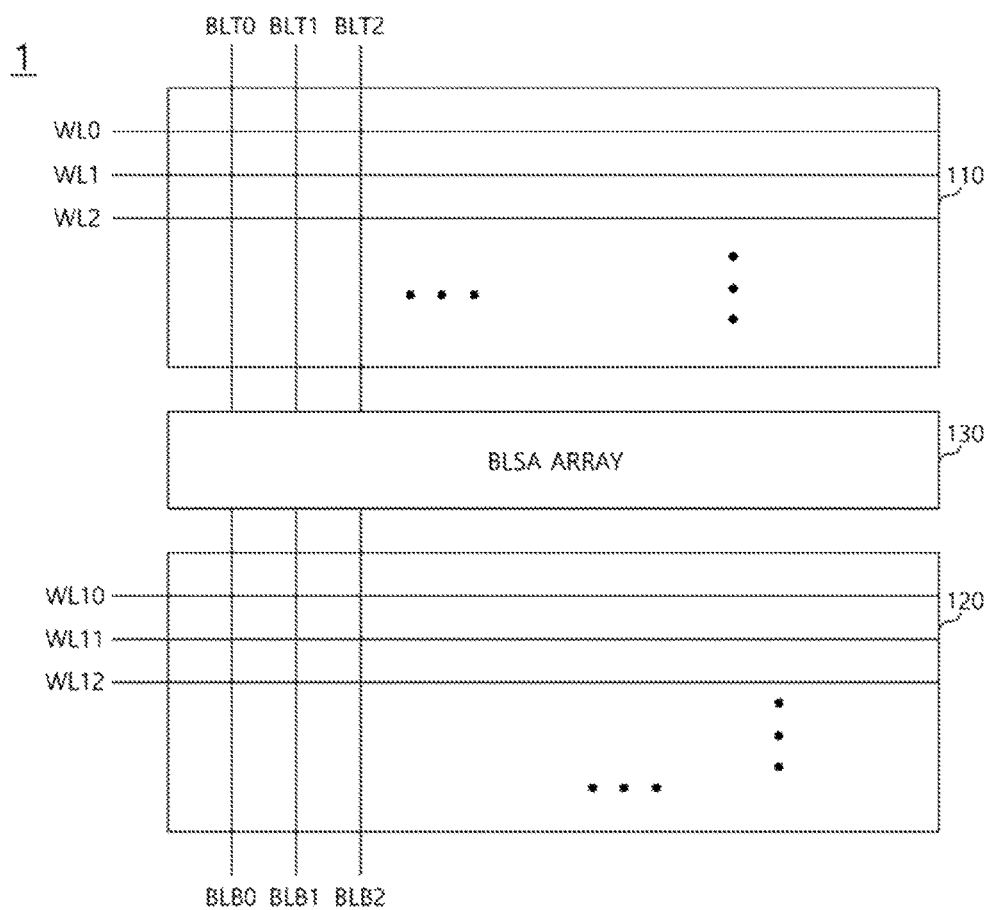
FIG. 1 is a schematic diagram illustrating a memory apparatus in accordance with an embodiment of the present disclosure.

Referring to FIG. 1, a memory apparatus 1 in accordance with an embodiment of the present disclosure may include upper and lower memory cell a rays 110 and 120, and a bit line sense-amplifier (BLSA) array 130.

The upper and lower memory cell arrays 110 and 120 may respectively include a plurality of bit lines BLT0, BLT1, BLT2, BLB0, BLB1, and BLB2, a plurality of word lines WL0, WL1, WL2, WL10 WL11, and WL12, and a plurality of memory cells disposed on cross points between the bit lines BLT0, BLT1, BLT2, BLB0, BLB1 and BLB2 and the word lines WL0, WL1, WL2, WL10, WL11, and WL12. Each memory cell may store and output data through selection of corresponding bit line and word line.

The bit line sense-amplifier array 130 may be disposed between the memory cell arrays 110 and 120. The bit line sense-amplifier array 130 may include a plurality of bit line sense-amplifiers. The bit line sense-amplifiers may be coupled to the bit lines BLT0, BLT1, and BLT2 of the upper memory cell array 110 and the bit lines BLB0, BLB1, and BLB2 of the lower memory cell array 120. The plurality of bit line sense-amplifiers may amplify levels of bit lines BLT0, BLT1, BLT2, BLB0, BLB1, and BLB2 according to data stored in the memory cell coupled to the bit lines BLT0, BLT1, BLT2, BLB0, BLB1, and BLB2. The memory apparatus 1 may have an open bit line structure, in which the bit line sense-amplifier array 130 couples bit lines BLT0, BLT1, and BLT2 of the upper memory cell array 110 and bit lines BLB0, BLB1, and BLB2 of the lower memory cell array 120.

The bit line sense-amplifier array 130 may precharge the bit lines BLT0, BLT1, BLT2, BLB0, BLB1, and BLB2, and may detect voltage level change of the bit lines BLT0, BLT1, BLT2 BLB0, BLB1, and BLB2 through charge sharing according to data stored in the memory cells when the word lines WL0, WL1, WL2, WL10, WL11, and WL12 are activated.

Figure 2:
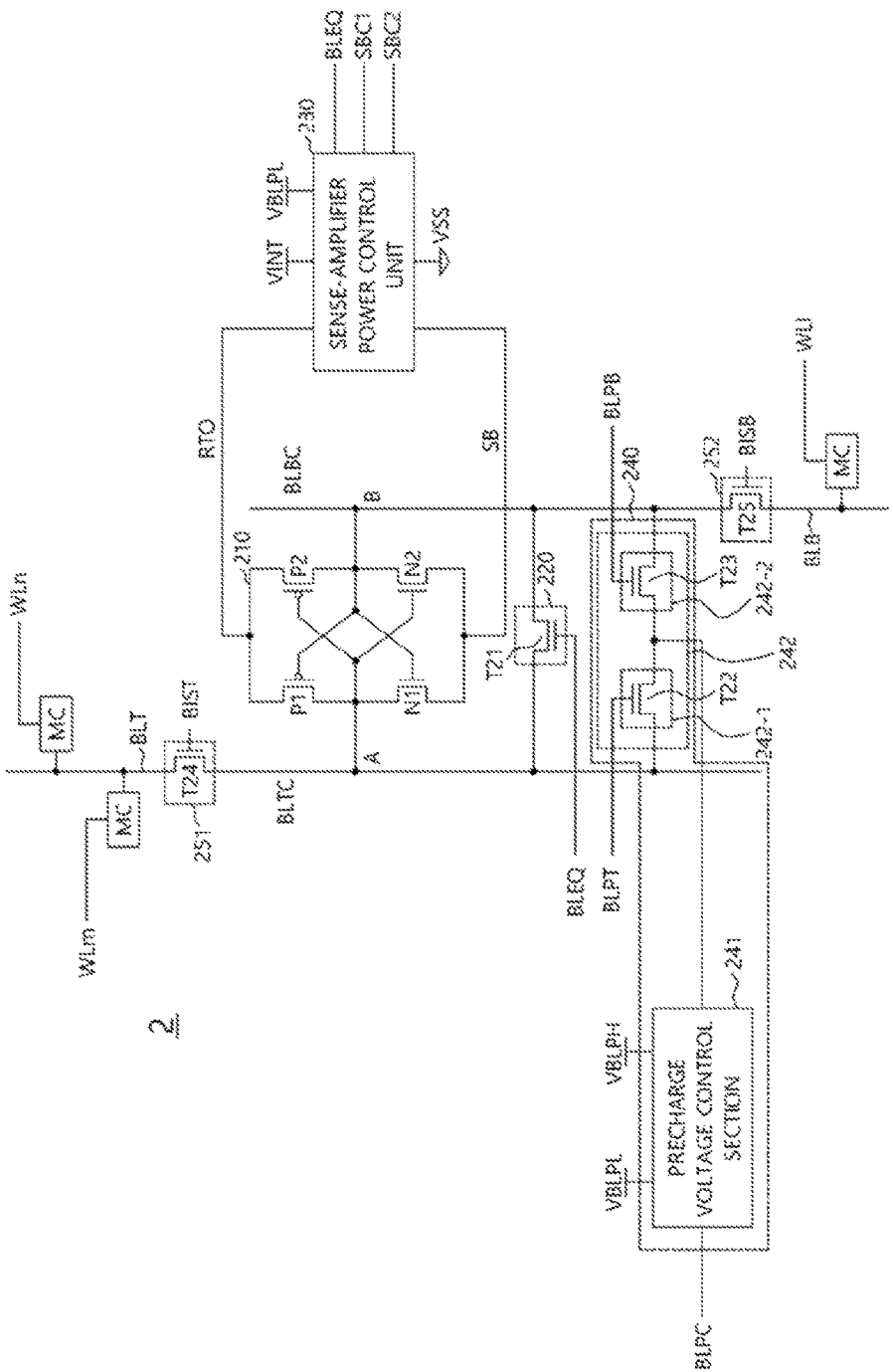
FIG. 2 is a circuit diagram illustrating a memory apparatus in accordance with an embodiment of the present disclosure.

FIG. 2 is a circuit diagram illustrating a memory apparatus 2 in accordance with an embodiment of the present disclosure.

Referring to FIG. 2, the memory apparatus 2 may include a first bit line BLT, a second bit line BLB, a bit line sense-amplifier 210, a first precharge unit 220, a sense-amplifier power control unit 230, and a second precharge unit 240.

The first bit line BLT may be one of the bit lines BLT0, BLT1, and BLT2 disposed on the upper memory cell array 110 described with reference to FIG. 1. The second bit line BLB may be one of the bit lines BLB0, BLB1, and BLB2 disposed on the lower memory cell array 120 described with reference to FIG. 1.

The bit line sense-amplifier 210 may be coupled to the first and second bit lines BLB and BLT. The bit line sense-amplifier 210 may be coupled to the first bit line BLT and the second bit line BLB through a first coupling line BLTC and a second coupling line BLBC, respectively. The bit line sense-amplifier 210 may be disposed in the bit line sense-amplifier array 130 described with reference to FIG. 1.

The first bit line BLT may cross a plurality of word lines WLm and WLn. Memory cells MC may be coupled to cross points between the first bit line BLT and the plurality of word fines WLm and WLn. In the similar manner, the second bit line BLB may cross a plurality of word lines WLI. Memory cells MC may be disposed at cross points between the second bit line BLB and the plurality of word lines WLI.

The memory apparatus 2 may further include a first bit line coupling unit 251 and a second bit line coupling unit 252.

The first bit line coupling unit 251 may receive a first bit line isolation signal BIST, and may couple the first coupling line BLTC and the first bit line BLT in response to the first bit line isolation signal BIST. For example, the first bit line coupling unit 251 may couple the first coupling line BLTC and the first bit line BLT when the first bit line isolation signal GIST is enabled, and may decouple the first coupling line BLTC and the first bit line BLT when the first bit line isolation signal GIST is disabled. Therefore, the first bit line coupling unit 251 may couple the first bit line BLT to the bit line sense-amplifier 210 when the first bit line isolation signal GIST is enabled.

The second bit line coupling unit 252 may receive a second bit line isolation signal BISB, and may couple the second coupling line BLBC and the second bit line BLB in response to the second bit line isolation signal BISB. For example, the second bit line coupling unit 252 may couple the second coupling line BLBC and the second bit line BLB when the second bit line isolation signal BISB is enabled, and may decouple the second coupling line BLBC and the second bit line BLB when the second bit line isolation signal BISB is disabled. Therefore, the second bit line coupling unit 252 may couple the second bit line BLB to the bit line sense-amplifier 210 when the second bit line isolation signal BISB is enabled.

The bit line sense-amplifier 210 may include a first input node A, a Second input node B, a first power node RTO, and a second power node SB. The first input node A may be coupled to the first bit lire BLT through the first coupling line BLTC. The second input node B may be coupled to the second bit line BLB through the second coupling line BLBC.

The bit line sense-amplifier 210 may receive power for sensing and amplifying operation through the first power node RTO and the second power node SB. The bit line sense-amplifier 210 may receive a plurality of powers from the sense-amplifier power control unit 230 through the first power node RTO and the second power node SB.

The bit line sense-amplifier 210 may include a plurality of transistors forming a cross-coupled structure. The bit line sense-amplifier 210 may include first and second PMOS transistors P1 and P2 and first and second NMOS transistors N1 and N2, which are cross-coupled. The first and second PMOS transistors P1 and P2 may be coupled between the first power node RTO and the first input node A and the second input node B, respectively. The first PMOS transistor P1 may be coupled to the second input node B at its gate. The second PMOS transistor P2 may be coupled to the first input node A at its gate. The first and second NMOS transistors N1 and N2 may be coupled between the second power node SB and the first input node A and the second input node B, respectively. The first NMOS transistor N1 may be coupled to the second input node B at its gate. The second NMOS transistor N2 may be coupled to the first input node A at its gate.

The first recharge unit 220 may receive a bit line equalization signal BLEQ. The first precharge unit 220 may couple the first coupling line BLTC and the second coupling line BLBC, or the first bit line BLT and the second bit line BLB in response to the bit line equalization signal BLEQ. The first precharge unit 220 may couple the first coupling line BLTC and the second coupling line BLBC to each other when the bit line equalization signal BLEQ is enabled, and may decouple the first coupling line BLTC and the second coupling line BLBC from each other when the bit line equalization signal BLEQ is disabled. The first precharge unit 220 may precharge the first coupling line BLTC and the second coupling line BLBC by equalizing voltage levels of the first coupling line BLTC and the second coupling line BLBC.

The sense-amplifier power control unit 230 may selectively provide the plurality of powers to the bit line sense-amplifier 210 in response to a power control signal. The plurality of powers may be provided from the sense-amplifier power control unit 230 to the bit line sense-amplifier 210 through the first power node RTO and the second power node SB. The sense-amplifier power control unit 230 may receive an internal voltage VINT, a first precharge voltage VBLPL, and a ground voltage VSS. For example, the internal voltage VINT may be a core voltage for a core region of the memory apparatus 2. The first precharge voltage VBLPL may be lower than the internal voltage VINT and higher than the ground voltage VSS. For example, the first precharge voltage VBLPL may be slightly lower than a half of the internal voltage VINT.

The power control signal may include first and second power control signals SBC1 and SBC2. The sense-amplifier power control unit 230 may provide one of the internal voltage VINT and the first precharge voltage VBLPL to the bit line sense-amplifier 210 through the second power node SB in response to the first power control signal SBC1. The sense-amplifier power control unit 230 may provide the ground voltage VSS to the bit line sense-amplifier 210 through the second power node SB in response to the second power control signal SBC2. Also, the sense-amplifier power control unit 230 may provide one of the internal voltage VINT and the first precharge voltage VBLPL to the bit line sense-amplifier 210 through the first power node RTO in response to the second power control signal SBC2. The sense-amplifier power control unit 230 may further receive the bit line equalization signal BLEQ. The sense-amplifier power control unit 230 may provide the first precharge voltage VBLPL to the bit line sense-amplifier 210 through the second power node 56 in response to the bit line equalization signal BLEQ.

The second precharge unit 240 may change the voltage levels of the first coupling line BLTC and the second coupling line BLBC based on a precharge control signal. The second precharge unit 240 may change the voltage levels of the first coupling line BLTC and the second coupling line BLBC when the first coupling line BLTC and the second coupling line BLBC are coupled to the first bit line BLT and the second, bit line BLB, respectively. The precharge control signal may include a precharge voltage selection signal BLPC, a first bit line precharge control signal BLPT, and a second bit line precharge control signal BLPB.

The second precharge unit 240 may include a precharge voltage control section 241 and, a bit line precharge, section 242.

The precharge voltage control section 241 may selectively provide one of the first precharge voltage VBLPL and a second precharge voltage VBLPH to the bit line precharge section 242 in response to the precharge voltage selection signal BLPC. For example, the precharge voltage control section 241 may provide the second precharge voltage VBLPH to the bit line precharge section 242 when the precharge voltage selection signal BLPC is enabled, and may provide the first precharge voltage VBLPL to the bit line precharge section 242 when the precharge voltage selection signal BLPC is disabled. The second precharge voltage VBLPH may be lower than the internal voltage VINT and higher than the first precharge voltage VBLPL. For example, the second precharge voltage VBLPH may be slightly higher than a half of the internal voltage VINT.

The bit line precharge section 242 may change voltage levels of the first coupling line BLTC and the second coupling line BLBC in response to the first bit line precharge control signal BLPT and the second bit line precharge control signal BLPB. The bit line precharge section 242 may change the voltage level of the first coupling fine BLTC to a level of voltage provided from the precharge voltage control section 241 when the first bit line precharge control signal BLPT is enabled, and may change the voltage level of the second coupling line BLBC to level of voltage provided from the precharge voltage control section 241 when the second bit line precharge control signal BLPB is enabled.

The bit line precharge section 242 may include a first bit line precharge portion 2424 and a second bit line precharge portion 242-2.

The first bit line precharge portion 242-1 may be coupled to the precharge voltage control section 241 and may change the voltage levels of the first coupling line BLTC and the first bit line BLT to the level of voltage provided from the precharge voltage control section 241 in response to the first bit line precharge control signal BLPT.

The second bit line precharge portion 242-2 may be coupled to the precharge voltage control section 241, and may change the voltage levels of the second coupling line BLBC and the second bit line BLB to the level of voltage provided from the precharge voltage control section 241 in response to the second bit line precharge control signal BLPB.

Referring to FIG. 2, the first precharge unit 220 may include a first transistor T21. The first transistor T21 may be a NMOS transistor. The first transistor T21 may be coupled to the first coupling line BLTC and the second coupling line BLBC, and may receive the bit line equalization signal BLEQ at its gate.

The first hit line precharge portion 242-1 may include a second transistor T22. The second transistor T22 may be a NMOS transistor. The second transistor T22 may be coupled to the first coupling line BLTC and the precharge voltage control section 241, and may receive the first bit line precharge control signal BLPT at its gate.

The second bit line precharge portion 242-2 may include a third transistor T23. The third transistor T23 may be a NMOS transistor. The third transistor T23 may be coupled to the second coupling line BLBC and the precharge voltage control section 241, and may receive the second bit line precharge control signal BLPB at its gate.

The first bit line coupling unit 251 and the second bit line coupling unit 252 may include a fourth transistor T24 and a fifth transistor T25, respectively. Each of the fourth transistor T24 and the fifth transistor T25 may be a NMOS transistor. The fourth transistor T24 may be coupled to the first bit line BLT and the first coupling line BLTC, and may receive the first bit line isolation signal BIST at its gate. The fifth transistor T25 may be coupled to the second bit line BLB and the second coupling line BLBC, and may receive the second bit line isolation signal BISB at its gate.

Figure 3:
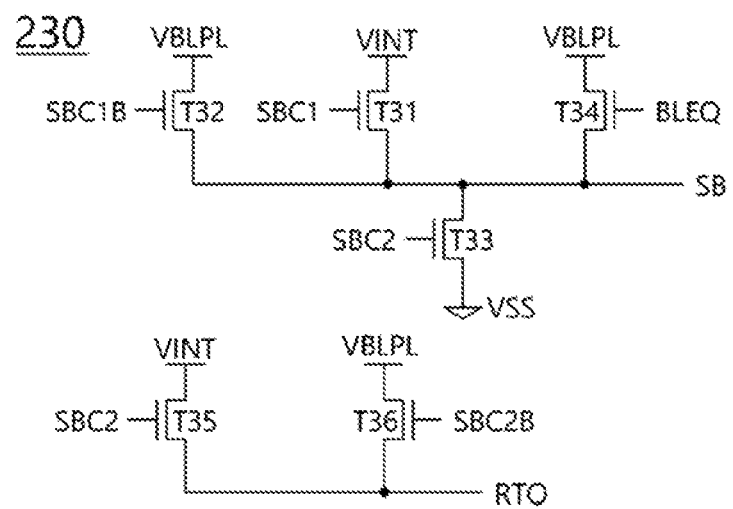
FIG. 3 is a circuit diagram illustrating a sense-amplifier power control unit shown in FIG. 2.

FIG. 3 is a circuit diagram illustrating the sense-amplifier power control unit 230 described with reference to FIG. 2. Referring to FIG. 3, the sense-amplifier power control unit 230 may include first to sixth transistors T31, T32, T33, T34, T35, and T36.

The first transistor T31 may receive the first power control signal SBC1 at its gate, may be coupled to the internal voltage VINT at its drain, and may be coupled to the second power node SB of the bit line sense-amplifier 210 at its source.

The second transistor T32 may receive an inverted signal SBC1B of the first power control signal SBC1 at its gate, may be coupled to the first precharge voltage VBLPL at its drain, and may be coupled to the second power node SB at its source.

The third transistor T33 may receive the second power control signal SBC2 at its gate, may be coupled to the second power node SB at its drain, and may be coupled to the ground voltage VSS at its source.

The fourth transistor T34 may receive the bit line equalization signal BLEQ at its gate, may be coupled to the first precharge voltage VBLPL at its drain, and may be coupled to the second power node SB at its source.

The fifth transistor T35 may receive the second power control signal SBC2 at its gate, may be coupled to the internal voltage VINT at its drain, and may be coupled to the first power node RTO of the bit line sense-amplifier 210 at its source.

The sixth transistor T36 may receive an inverted signal SBC2B of the second power control signal SBC2 at its gate, may be coupled to the first precharge voltage VBLPL at its drain, and may be coupled to the first power node RTO at its source.

Therefore, the sense-amplifier power control unit 230 may provide various power to the bit line sense-amplifier 210 through the first power node RTO and the second power node SB when each of the first power control signal SBC1, the second power control signal SBC2 and the bit line equalization signal BLEQ is enabled.

Figure 4:
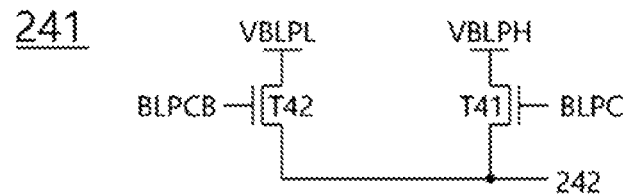
FIG. 4 is a circuit diagram illustrating a precharge voltage control section shown in FIG. 2.

FIG. 4 is a circuit diagram illustrating the precharge voltage control section 241 described with reference to FIG. 2. Referring to FIG. 4, the precharge voltage control section 241 may include first and second transistors T41 and T42.

The first transistor T41 may receive the precharge voltage selection signal BLPC at its gate, may be coupled to the second precharge voltage VBLPH at its drain, and may be coupled to the bit line precharge section 242 at its source.

The second transistor T42 may receive an inverted signal BLPCB of the precharge voltage selection signal BLPC at its gate, may be coupled to the first precharge voltage VBLPL at its drain, and may be coupled to the bit line precharge section 242 at its source.

Figure 5:
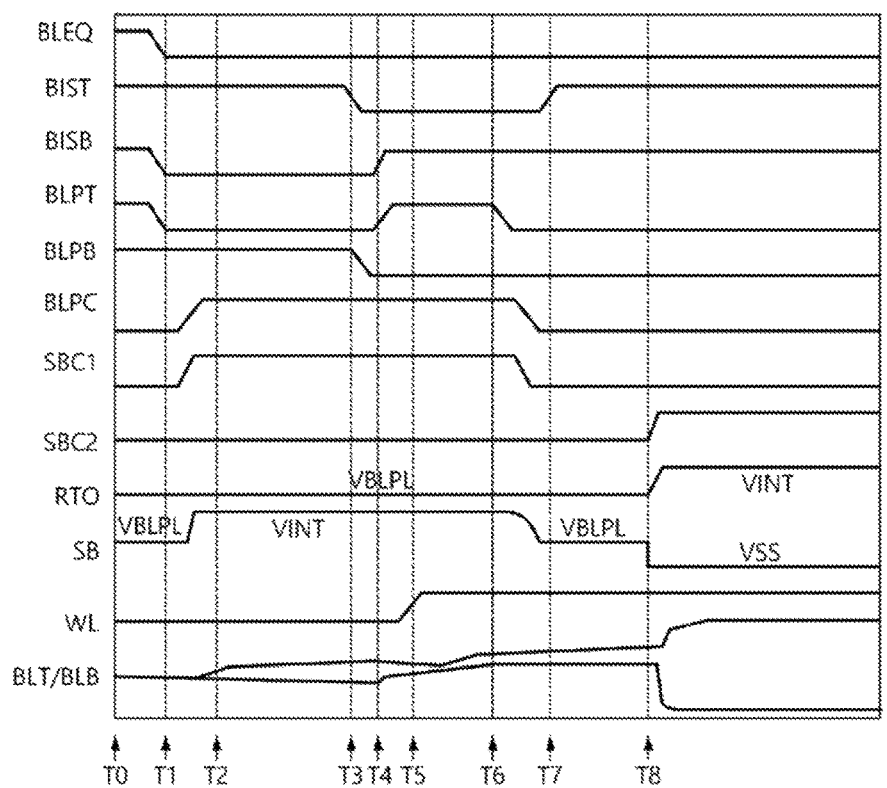
FIG. 5 is timing diagram illustrating an operation of the memory apparatus in accordance with an embodiment of the present disclosure.

FIG. 5 is a timing diagram illustrating an operation the memory apparatus 2 described with reference to FIG. 2. The operation of the memory apparatus 2 in accordance with an embodiment of the present disclosure will be described with reference to FIGS. 2 to 5 as follows.

At time point T0, the bit line equalization signal BLEQ, the first bit line precharge control signal BLPT, the second bit line precharge control signal BLPB, the first bit line isolation signal BIST, and the second bit line isolation signal BISB may be enabled. The precharge voltage control section 241 may provide the first precharge voltage VBLPL to the bit line precharge section 242 according to the disabled precharge voltage selection signal BLPC, and the first coupling line BLTC, the second coupling line BLBC, the first bit line BLT, and the second bit line BLB may be precharge d to the level of the first precharge voltage VBLPL. The memory apparatus 2 may receive an active signal from the external apparatus such as a controller.

At this time, the sense-amplifier power control unit 230 may provide the first precharge voltage VBLPL to the bit line sense-amplifier 210 through the second power node SB in response to the bit line equalization signal BLEQ, and may provide the first precharge voltage VBLPL to the bit line sense-amplifier 210 through the first power node RTO in response to the second power control signal SBC2. Therefore, the bit line sense-amplifier 210 may stay deactivated.

During the time section between time points T0 and T1, the bit line equalization signal BLEQ and the first bit line precharge control signal BLPT may be disabled. Therefore, the first coupling line BLTC and the second coupling line BLBC may be decoupled from each other. Also, the second bit line isolation signal BISB may be disabled and thus the second coupling line BLBC and the second bit line BLB may be decoupled from each other.

During the time section between time points T1 and T3, the first coupling line BLTC and the first bit line BLT may be precharged.

During the time section between time points T1 and T2, the precharge voltage selection signal BLPC may be enabled and the first power control signal SBC1 may be enabled. In response to the enabled precharge voltage selection signal BLPC, the precharge voltage control section 241 may provide the second precharge voltage VBLPH to the second coupling line BLBC through the second bit line precharge position 242-2 and thus the second coupling line BLBC may have the voltage level of the second precharge voltage VBLPH.

Also, the sense-amplifier power control unit 230 may provide the internal voltage VINT to the bit line sense-amplifier 210 through the second power node SB in response to the enabled first power control signal SBC1.

During the time section between time points T2 and T3, the second coupling line BLBC may have the voltage level of the second precharge voltage VBLPH and thus the first NMOS transistor N1 may receive the second precharge voltage VBLPH at its gate. At this time, the second power node SB may have the voltage level of the internal voltage VINT and thus the voltage level of the first input node A may be the second precharge voltage VBLPH minus a threshold voltage VthN1 of the first NMOS transistor (VBLPH−VthN1). Therefore, the voltage level of the first coupling line BLTC may be the second precharge voltage VBLPH minus a threshold voltage VthN1 of the first NMOS transistor (VBLPH−VthN1), and thus the voltage level of the first bit line BLT, which is coupled to the first coupling line BLTC through the first bit line coupling unit 251, may also be the second precharge voltage VBLPH minus a threshold voltage VthN1 of the first NMOS transistor (VBLPH−VthN1).

During the time section between time points T3 and T6, the second coupling line BLBC and the second bit line BLB may be precharged.

During the time section between time points T3 and T4, the first bit line isolation signal BIST may be disabled and thus the first bit line BLT may be floated with the voltage level of the second precharge voltage VBLPH minus a threshold voltage VthN1 of the first NMOS transistor (VBLPH−VthN1) while the second bit line isolation signal BISB may be enabled and thus the second coupling line BLBC and the second bit line BLB may be coupled to each other. Also, the first bit line precharge control signal BLPT may be enabled and the second bit line precharge control signal BLPB may be disabled. Therefore, the first coupling line BLTC may have the voltage level of the second precharge voltage VBLPH.

During the time section between time points T4 and T6, the second NMOS transistor N2 may receive the second precharge voltage VBLPH at its gate and thus the second input node B may have the voltage level of the second precharge voltage VBLPH minus a threshold voltage VthN2 of the second NMOS transistor N2 (VBLPH−VthN2).

At time point T5, a particular word line WL may be activated and there may be the charge sharing between the first bit line BLT and a memory cell selected by the activated word line WL.

During the time section between time points T6 and T7, the first bit line precharge control signal BLPT, the precharge voltage selection signal BLP, and the first power control signal SBC1 may be disabled while the first bit line isolation signal BIT may be enabled again.

During the time section between time point T7 and T8, the first input node A of the bit line sense-amplifier 210 may have an increased voltage level from the second precharge voltage VBLPH minus a threshold voltage VthN1 of the first NMOS transistor (VBLPH−VthN1) through the charge sharing, and the second input node B of the bit line sense-amplifier 210 may have the voltage level of the second precharge voltage VBLPH minus a threshold voltage VthN2 of the second NMOS transistor N2 (VBLPH−VthN2). That is, when data stored in the memory cell has a value of "1", the first input node A may have higher voltage level than the second input node B through the charge sharing.

At time point T8 the second power control signal SBC2 may be enabled, and the sense-amplifier power control unit 230 may provide the ground voltage VSS to the bit line sense-amplifier 210 through the second power node SB and may provide the internal voltage VINT to the bit line sense-amplifier 210 through the first power node RTO. Therefore, the bit line sense-amplifier 210 may be activated. The bit line sense-amplifier 210 may sense and amplify the voltage levels of the first and second input nodes A and B. A driving current of a transistor may be proportional to difference (Vgs−Vth) between a threshold voltage and voltage between a gate and a source of the transistor. During the amplifying operation of the bit line sense-amplifier 210, the difference (Vgs−Vth) between the threshold voltage and the voltage between the gate and the source of the first NMOS transistor N1 may be the voltage level, which is set through the precharge operation, minus the threshold voltage VthN2 of the second NMOS transistor N2 (VBLPH+VCS−(VthN1+VthN2) where VCS represents the increased voltage level through the charge sharing) while the difference (Vgs−Vth) between the threshold voltage and voltage between the gate and the source of the second NMOS transistor N2 may be the voltage level, which is set through the precharge operation, minus the threshold voltage VthN1 of the first NMOS transistor N1 (VBLPH−(VthN1+VthN2)).

Therefore, when the bit line sense-amplifier 210 is activated, currents flowing through the first and second NMOS transistors N1 and N2 may be substantially the same as each other. As a result, even when the first and second NMOS transistors N1 and N2 have different process skews or offsets from each other, the mismatch may be compensated due to the precharge operation in accordance with an embodiment of the present disclosure.

Figure 6:
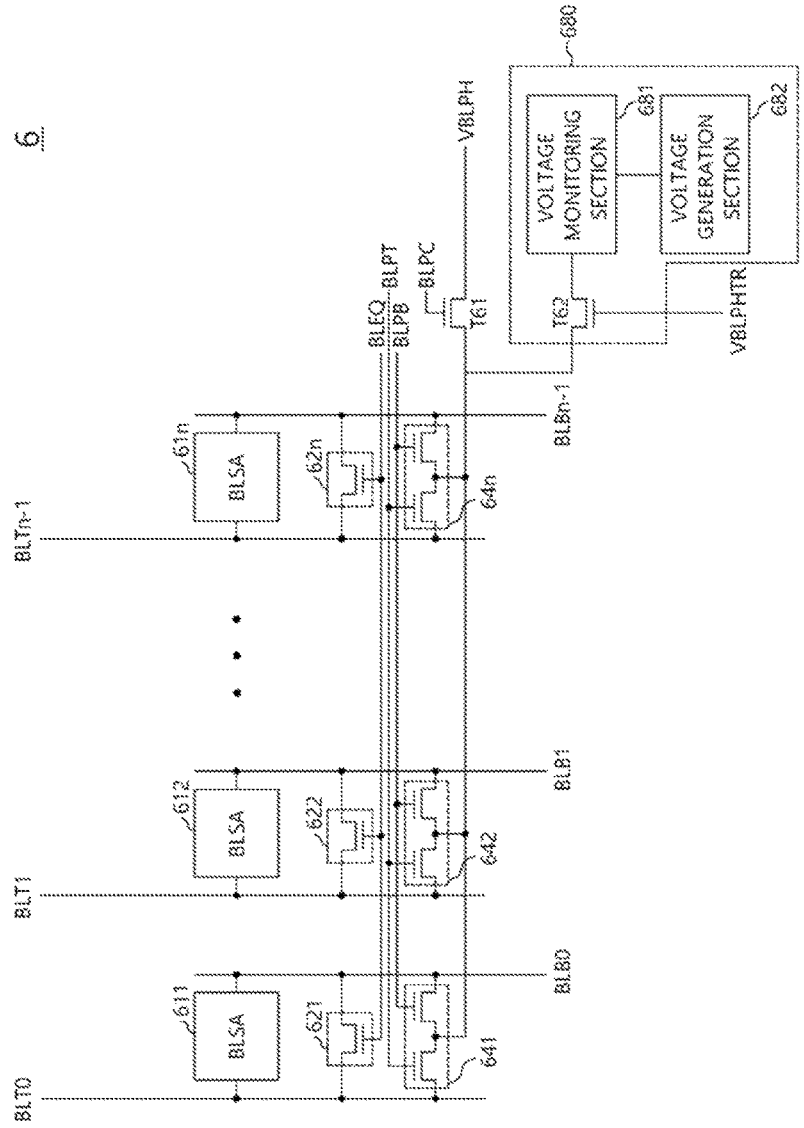
FIG. 6 is a circuit diagram illustrating a memory apparatus in accordance with an embodiment of the present disclosure.

FIG. 6 is a circuit diagram illustrating a memory apparatus 6 in accordance with an embodiment of the present disclosure.

Referring to FIG. 6, the memory apparatus 6 may include a plurality of bit line sense-amplifiers 611 to 61n coupled to a plurality of bit line pairs BLT0 and BLB0 to BLTn-1 and BLBn-1. The plurality of bit line pairs BLT0 and BLB0 to BLTn-1 and BLBn-1 may be disposed in one or more of the upper memory cell array 110 and the lower memory cell array 120 described with reference to FIG. 1. The memory apparatus 6 may include the memory apparatus 2 described with reference to FIG. 2 in plural corresponding to a number of the plurality of bit line pairs BLT0 and BLB0 to BLTn-1 and BLBn-1.

The first precharge units 621 to 62n respectively coupled to the plurality of bit line pairs BLT0 and BLB0 to BLTn-1 and BLBn-1 may commonly receive the bit line equalization signal BLEQ.

The second precharge units 641 to 64n respectively coupled to the plurality of bit line pairs BLT0 and BLB0 to BLTn-1 and BLBn-1 may commonly receive the first bit line precharge control signal BLPT and the second bit line precharge control signal BLPB, and may commonly receive the second precharge voltage VBLPH according to the precharge voltage selection signal BLPC. A first transistor T61 may correspond to the first transistor T41 of the precharge voltage control section 241 described with reference to FIGS. 2 and 4.

The memory apparatus 6 may further include a precharge voltage adjustment unit 680. The memory apparatus 6 may control the voltage level of the second precharge voltage VBLPH through the precharge voltage adjustment unit 680.

The NMOS transistors included in the plurality of bit line sense-amplifiers 611 to 61n respectively coupled to the plurality of bit line pairs BLT0 and BLB0 to BLTn-1 and BLBn-1 may have different process skews from one another. For example, a NMOS transistor of the bit line sense-amplifier 611 coupled to a first pair of bit lines BLT0 and BLB0 may have relatively fast process skew while a NMOS transistor of the bit line sense-amplifier 612 coupled to a second pair of bit lines BLT1 and BLB1 may have relatively slow process skew. Difference of the process skews may be represented by difference of threshold voltages of the NMOS transistors. For performance optimization of the memory apparatus 6, there may be a need for voltage level control of the second precharge voltage VBLPH in consideration of average value of the threshold voltages of all the NMOS transistors included in the plurality of bit line sense-amplifiers 611 to 61n. After completion of the precharge operation of the plurality of bit line pairs BLT0 and BLB0 to BLTn-1 and BLBn-1, the memory apparatus 6 may perform further operation for the voltage level control of the second precharge voltage VBLPH.

The precharge voltage adjustment unit 680 may include a second transistor T62, a voltage monitoring section 681 and a voltage generation section 682.

The second transistor 162 may couple the second precharge units 641 to 64n to the voltage monitoring section 681 in response to a monitoring control signal VBLPHTR. The voltage monitoring section 681 may be coupled to each of the second precharge units 641 to 64n through the second transistor T62.

When the precharge operation to the plurality of bit line pairs BLT0 and BLB0 to BLTn-1 and BLBn-1 is completed, the bit line equalization signal BLEQ may be enabled and the first bit line precharge control signal BLPT and the second bit line precharge control signal BLPB may be enabled f monitoring of the voltage levels of the plurality of bit fine pairs BLT0 and BLB0 to BLTn-1 and BLBn-1. Also, when the monitoring control signal VBLPHTR is enabled, the voltage, monitoring section 681 may be coupled to the plurality of bit line pairs BLT0 and BLB0 to BLTn-1 and BLBn-1.

Therefore, the voltage monitoring section 681 may monitor the voltage levels of the plurality of bit line pairs BLT0 and BLB0 to BLTn-1 and BLBn-1. The precharged voltage levels of the bit line pairs BLT0 and BLB0 to BLTn-1 and BLBn-1 may be different from one another according to the threshold voltages of the NMOS transistors included in the bit line sense-amplifiers 611 to 61n. Therefore, the voltage monitoring section 681 may monitor the average value of the voltage levels of the plurality of bit line pairs BLT0 and BLB0 to BLTn-1 and BLBn-1.

A monitoring result of the voltage monitoring section 681 may be used for adjustment of the voltage level of the second precharge voltage VBLPH. For example, when the average value of the voltage levels of the plurality of bit line pairs BLT0 and BLB0 to BLTn-1 and BLBn-1 is higher than a threshold value, the voltage level of the second precharge voltage VBLPH may be controlled to be lowered. When the average value of the voltage levels of the plurality of bit line pairs BLT0 and BLB0 to BLTn-1 and BLBn-1 is lower than the threshold value, the voltage level of the second precharge voltage VBLPH may be controlled to be elevated. The threshold value may be arbitrarily set for optimizing the operation of the memory apparatus 6.

The voltage generation section 682 may adjust the second precharge voltage VBLPH. For example, the voltage generation section 682 may gradually increase or decrease the voltage level of the second precharge voltage VBLPH based on the monitoring result of the voltage monitoring section 681. The memory apparatus 6 may adjust the voltage level of the second precharge voltage VBLPH through the precharge voltage adjustment unit 680. Therefore, operation performance of chips manufactured in different wafers may be optimized besides optimization of operation performance of the bit line sense-amplifiers in a single chip.

Figure 7:
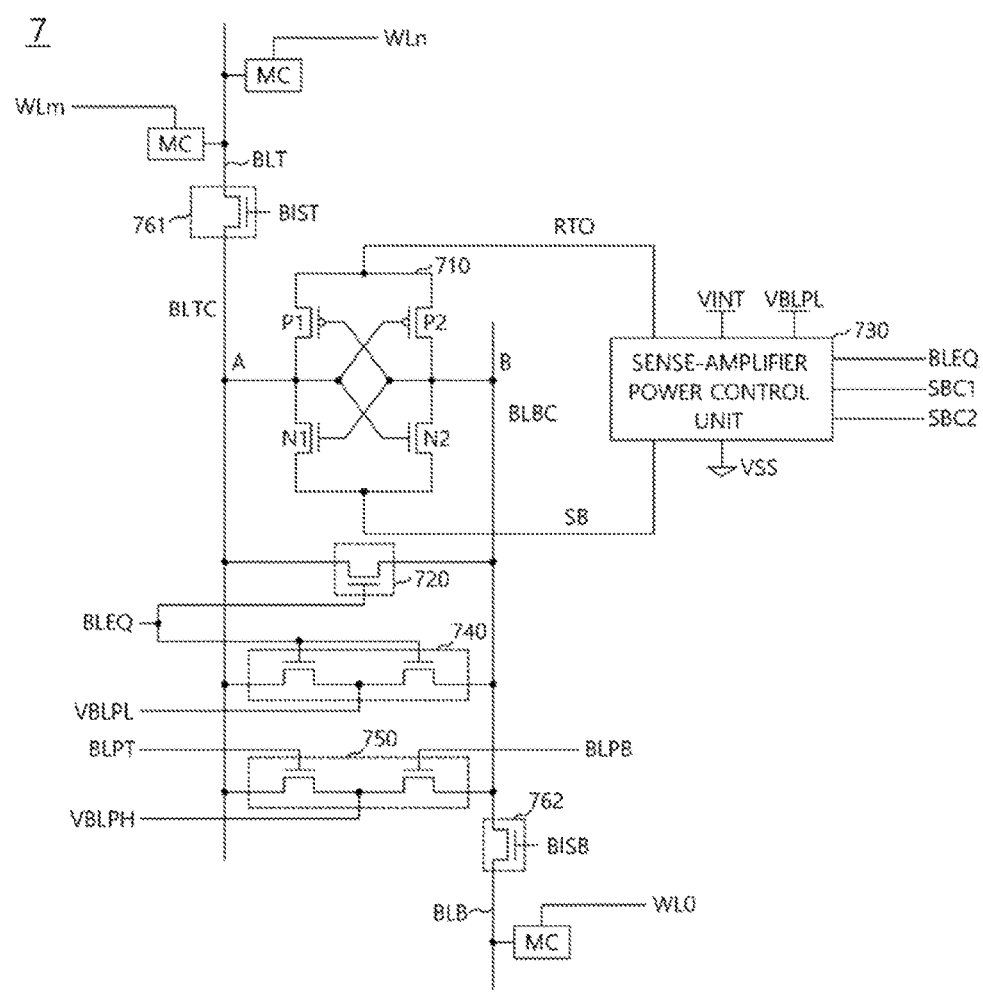
FIG. 7 is a circuit diagram illustrating a memory apparatus in accordance with an embodiment of the present disclosure.

FIG. 7 is a circuit diagram illustrating a memory apparatus 7 in accordance with an embodiment of the present disclosure.

Referring to FIG. 7, the memory apparatus 7 may include a bit line sense-amplifier 710, a first precharge unit 720, a sense-amplifier power control unit 730, a second precharge unit 740, and a third precharge unit 750.

The memory apparatus 7 of FIG. 7 may be substantially the same as the memory apparatus 2 described with reference to FIG. 2 except for the second precharge unit 740 and the third precharge unit 750. The second precharge unit 740 and the third precharge unit 750 may perform similar operation to that of the second precharge unit 240 described with reference to FIG. 2. The third precharge unit 750 may correspond to the bit line precharge section 242 described with reference to FIG. 2.

The bit line sense-amplifier 710 may include a first input node A, a second input node B, a first power node RTO, and a second power node SB. The first input node A may be coupled to the first bit line BLT through the first coupling line BLTC. The second input node B may be coupled to the second bit line BLB through the second coupling line BLBC. The bit line sense-amplifier 710 may receive power from the sense-amplifier power control unit 730 through the first power node RTO and the second power node SB.

The first precharge unit 720 may receive the bit line equalization signal BLEQ, and may couple the first coupling line BLTC and the second coupling line BLBC to each other. The bit line sense-amplifier 710 may include first and second PMOS transistors P1 and P2, and first and second NMOS transistors N1 and N2 forming a cross-coupled structure.

The sense-amplifier power control unit 730 may selectively provide the power to the bit line sense-amplifier 710 through the first power node RTO and the second power node SB in response to the power control signal and the bit line equalization signal BLEQ.

The power control signal may include first and second power control signals SBC1 and SBC2. The power may include an internal voltage VINT, a first precharge voltage VBLPL, and a ground voltage VSS. The sense-amplifier power control unit 730 may provide the first precharge voltage VBLPL to the bit line sense-amplifier 710 through the second power node SB in response to the bit line equalization signal BLEQ. The sense-amplifier power control unit 730 may provide one of the internal voltage VINT and the first precharge voltage VBLPL to the bit line sense amplifier 710 through the second power node SB in response to the first power control signal SBC1. The sense-amplifier power control unit 730 may provide the ground voltage VSS to the bit line sense-amplifier 710 through the second power node SB in response to the second power control signal SBC2. Also, the sense-amplifier power control unit 730 may provide one of the internal voltage VINT and the first precharge voltage VBLPL to the bit line sense-amplifier 710 through the first power node RTO in response to the second power control signal SBC2.

The second precharge unit 740 may change the voltage levels of the first coupling line BLTC and the second coupling line BLBC to the first precharge voltage VBLPL in response to the bit line equalization signal BLEQ.

The third precharge unit 750 may provide the second precharge voltage VBLPH to the first coupling line BLTC and the second coupling line BLBC in response to a bit line precharge control signal. The bit line precharge control signal may include a first bit line precharge control signal BLPT and a second bit line precharge control signal BLPB. The third precharge unit 750 may provide the second precharge voltage VBLPH to the first coupling line BLTC in response to the first bit line precharge control signal BLPT. The third precharge unit 750 may provide the second precharge voltage VBLPH to the second coupling line BLBC in response to the second bit line precharge control signal BLPB.

The memory apparatus 7 may further include a first bit line coupling unit 761 and a second bit line coupling unit 762. The first bit line coupling unit 761 may couple the first coupling line BLTC and the first bit line BLT in response to the first bit line isolation signal BIST. The second bit line coupling unit 762 may couple the second coupling line BLBC and the second bit line BLB in response to the second bit line isolation signal BISB.

Figure 8:
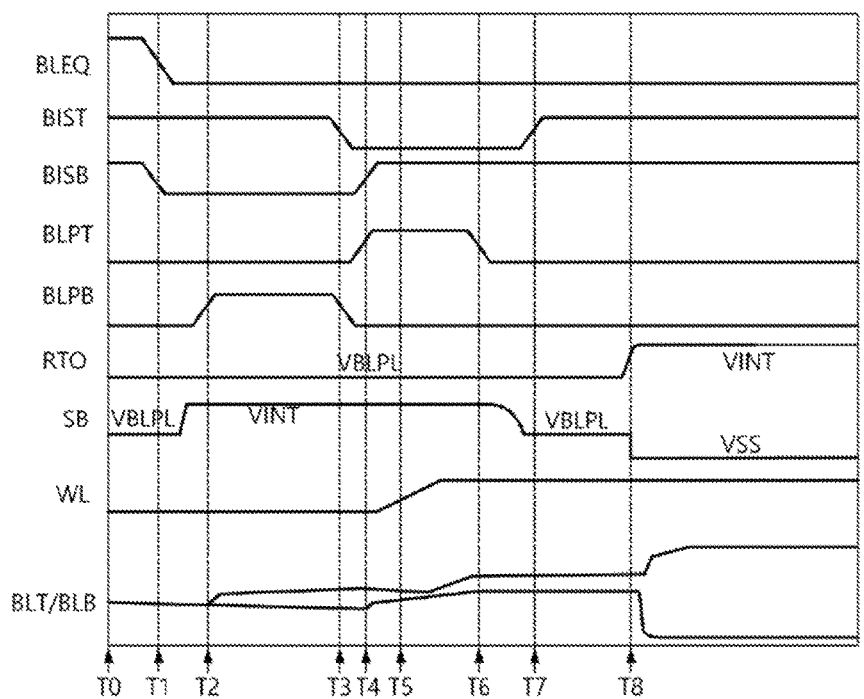
FIG. 8 is a timing diagram illustrating an operation of the memory apparatus in accordance with an embodiment of the present disclosure.

FIG. 8 is a timing diagram illustrating an operation of the memory apparatus 7 described with reference to FIG. 7. The operation of the memory apparatus 7 in accordance with an embodiment of the present disclosure will be described with reference to FIGS. 7 and 8 as follows.

At time point T0, the bit line equalization signal BLEQ the first bit line isolation signal BIST, and the second bit line isolation signal BISB may be enabled. The first bit line BLT and the second bit line BLB may be precharged to the level of the first precharge voltage VBLPL by the first precharge unit 720 and the second precharge unit 740. The memory apparatus 7 may receive an active signal from the external apparatus such as a controller.

During the time section between time points T0 and T1, the bit line equalization signal BLEQ may be disabled. Therefore, the first coupling line BLTC and the second coupling line BLBC may be decoupled from each other. Also, the second bit line isolation signal BISB may be disabled and thus the second coupling line BLBC and the second bit line BLB may be decoupled from each other.

During the time section between time points T1 and T3, the first coupling line BLTC and the first bit line BLT may be precharged.

During the time section between time points T1 and T2, the second bit line precharge control signal BLPB may be enabled. In response to the enabled second bit line precharge control signal BLPB, the second coupling line BLBC may have the voltage level of the second precharge voltage VBLPH by the third precharge unit 750. Also, the senseamplifier power control unit 730 may provide the internal voltage VINT to the bit line sense-amplifier 710 through the second power node SB.

During the time section between time points T2 and T3, the second coupling line BLBC may have the voltage level of the second precharge voltage VBLPH and thus the first NMOS transistor N1 may receive the second precharge voltage VBLPH at its gate. At this time, the second power node SB may have the voltage level of the internal voltage VINT and thus the voltage level of the first input node A may be the second precharge voltage VBLPH minus a threshold voltage VthN1 of the first NMOS transistor (VBLPH−VthN1). Therefore, the voltage level of the first coupling line BLTC may be the second precharge voltage VBLPH minus a threshold voltage VthN1 of the first NMOS transistor (VBLPH−VthN1), and thus the voltage level of the first bit line BLT, which is coupled to the first coupling line BLTC through the first bit line coupling unit 761, may also be the second precharge voltage VBLPH minus a threshold voltage VthN1 of the first NMOS transistor (VBLPH−VthN1).

During the time section between time points T3 and T6, the second coupling line BLBC and the second bit line BLB may be precharged.

During the time section between time points T3 and T4, the first bit line isolation signal BIST may be disabled and thus the first bit line BLT may be floated with the voltage level of the second precharge voltage VBLPH minus a threshold voltage VthN1 of the first NMOS transistor (VBLPH−VthN1) while the second bit line isolation signal BISB may be enabled and thus the second coupling line BLBC and the second bit line BLB may be coupled to each other. Also, the first bit line precharge control signal BLPT may be enabled and the second bit line precharge control signal BLPB may be disabled. Therefore, the first coupling line BLTC may have the voltage level of the second precharge voltage VBLPH by the third precharge unit 750.

During the time section between time points T4 and T6, the second NMOS transistor N2 may receive the second precharge voltage VBLPH at its gate and thus the second input node B may have the voltage level of the second precharge voltage VBLPH minus a threshold voltage VthN2 of the second NMOS transistor N2 (VBLPH−VthN2).

At time point T5, a particular word line WL may be activated and there may be the charge sharing between the first bit line BLT and a memory cell selected by the activated word line WL.

During the time section between time points T6 and T7, the first bit line precharge control signal BLPT may be disabled while the first bit line isolation signal BIST may be enabled again.

During the time section between time point T7 and T8, the first input node A of the bit line sense-amplifier 710 may have an increased voltage level from the second precharge voltage VBLPH minus a threshold voltage VthN1 of the first NMOS transistor (VBLPH−VthN1) through the charge sharing, and the second input node B of the bit line sense-amplifier 710 may have the voltage level of the second precharge voltage VBLPH minus a threshold voltage VthN2 of the second NMOS transistor N2 (VBLPH−VthN2).

At time point T8, the sense-amplifier power control unit 730 may provide the ground voltage VSS to the bit line sense-amplifier 710 through the second power node SB and may provide the internal voltage VINT to the bit line sense-amplifier 710 through the first power node RTO. Therefore, the bit line sense-amplifier 710 may sense and amplify the voltage levels of the first and second input nodes A and B. A driving current of a transistor may be proportional to difference (Vgs−Vth) between a threshold voltage and voltage between a gate and a source of the transistor. During the amplifying operation of the bit line sense-amplifier 710, the difference (Vgs−Vth) between the threshold voltage and voltage between the gate and the source of the first NMOS transistor N1 may be the voltage level, which is set through the precharge operation, minus the threshold voltage VthN2 of the second NMOS transistor N2 (VBLPH+VCS−(VthN1+VthN2) where VCS represents the increased voltage level through the charge sharing) while the difference (Vgs−Vth) between the threshold voltage and voltage between the gate and the source of the second NMOS transistor N2 may be the voltage level, which is set through the precharge operation, minus the threshold voltage VthN1 of the first NMOS transistor N1 (VBLPH−(VthN1+VthN2)).

Therefore, when the bit line sense-amplifier 710 is activated, currents flowing through the first and second NMOS transistors N1 and N2 may be substantially the same as each other. As a result, even when the first and second NMOS transistors N1 and N2 have different process skews or offsets from each other, the mismatch may be compensated due to the precharge operation in accordance with an embodiment of the present disclosure.

Figure 9:
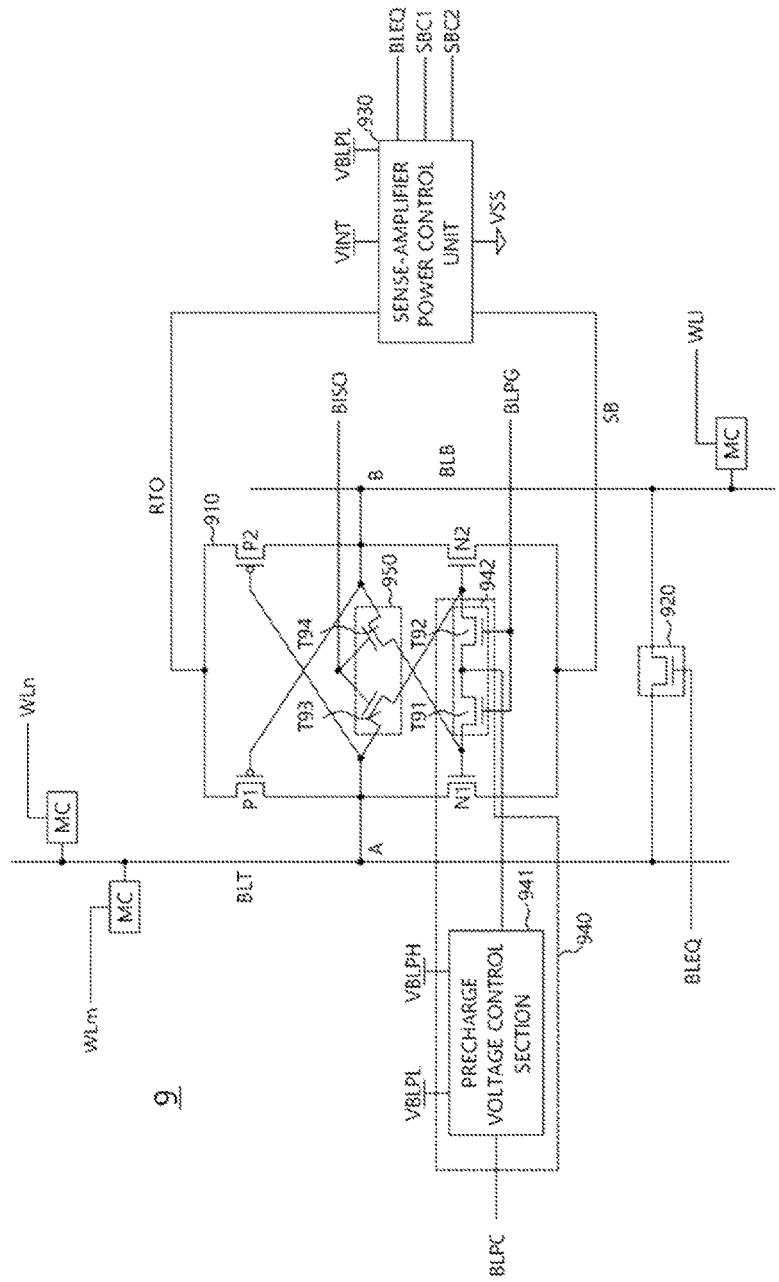
FIG. 9 is a circuit diagram illustrating a memory apparatus in accordance with an embodiment of the present disclosure.

FIG. 9 is a circuit diagram illustrating a memory apparatus 9 in accordance with an embodiment of the present disclosure.

Referring to FIG. 9, the memory apparatus 9 may include a bit line sense-amplifier 910, a first precharge unit 920, a sense-amplifier power control unit 930, a second precharge unit 940, and a third precharge unit 950.

The bit line sense-amplifier 910, the first precharge unit 920, and the sense-amplifier power control unit 930 may be substantially the same as those described with reference to FIGS. 2 and 7 and thus detailed description for the elements will be omitted.

The second precharge unit 940 may selectively provide one of the first precharge voltage VBLPL and the second precharge voltage VBLPH to the bit line sense-amplifier 910 in response to the precharge voltage selection signal BLPC and a first precharge control signal BLPG. The second precharge unit 940 may include a precharge voltage control section 941 and a gate control section 942.

The precharge voltage control section 941 may selectively provide one of the first precharge voltage VBLPL and the second precharge voltage VBLPH to the gate control section 942 in response to the precharge voltage selection signal BLPC. For example, the precharge voltage control section 941 may provide the second precharge voltage VBLPH to the gate control section 942 when the precharge voltage selection signal BLPC is enabled, and may provide the first precharge voltage VBLPL to the gate control section 942 when the precharge voltage selection signal BLPC is disabled.

The gate control section 942 may couple gates of the first and second NMOS transistors N1 and N2 included in the bit line sense-amplifier 910 and may provide the gates of the first and second NMOS transistors N1 and N2 with the voltage provided by the precharge voltage control section 941 in response to the first precharge control signal BLPG.

The third precharge unit 950 of the memory apparatus 9 may substitute for the first and second coupling units 251, 252, 761, and 762 of the memory apparatuses 2 and 7 described with reference to FIGS. 2 and 7. The third precharge unit 950 may decouple the cross coupling of the bit line sense-amplifier 910 in response to a second precharge control signal BISO. That is, the third precharge unit 950 may decouple the cross coupling between the first and second input nodes A and B and gates f the first and second NMOS transistors N1 and N2 of the bit line sense-amplifier 910, respectively. The third precharge unit 950 may couple the first input node A and the gate of the second NMOS transistor N2 and may couple the second input node B and the gate of the first NMOS transistor N1 when the second precharge control signal BISO is enabled. The third precharge unit 950 may decouple the first input node A and the gate of the second NMOS transistor N2 from each other and may decouple the second input node B and the gate of the first NMOS transistor N1 from each other when the second precharge control signal BISO is disabled.

Referring to FIG. 9, the gate control section 942 may include first and second transistors T91 and T92. The first transistor T91 may receive the first precharge control signal BLPG at its gate, may be coupled to the gate of the first NMOS transistor N1 at one of its drain and source, and may be coupled to the precharge voltage control section 941 at the other one of its drain and source. The second transistor T92 may receive the first precharge control signal BLPG at its gate, may be coupled to the gate of the second NMOS transistor N2 at one of its drain and source, and may be coupled to the precharge voltage control section 941 at the other one of its drain and source.

The third precharge unit 950 may include third and fourth transistors T93 and T94. The third transistor T93 may receive the second precharge control signal BISO at its gate, may be coupled to the gate of the second NMOS transistor N2 at one of its drain and source, and may be coupled to the first input node A at the other one of its drain and source. The fourth transistor T94 may receive the second precharge control signal BISO at its gate, may be coupled to the gate of the first NMOS transistor N1 at one of its drain and source, and may be coupled to the second input node B at the other one of its drain and source.

Figure 10:
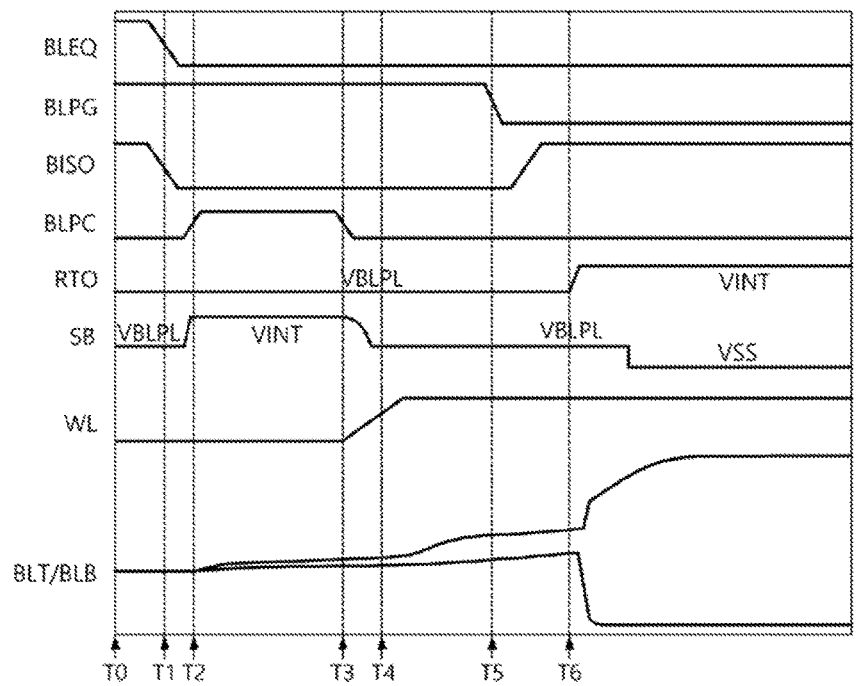
FIG. 10 is a timing diagram illustrating an operation of the memory apparatus in accordance with n embodiment of the present disclosure.

FIG. 10 is a timing diagram illustrating an operation or the memory apparatus 9 described with reference to FIG. 9. The operation of the memory apparatus 9 in accordance with an embodiment of the present disclosure will be described with reference to FIGS. 9 and 10 as follows.

During the time section between time points T0 and T1, the bit line equalization signal BLEQ, the first precharge control signal BLPG, and the second precharge control signal BISO may be enabled while the precharge voltage selection signal BLPC may stay disabled. The sense-amplifier power control unit 930 may provide the first precharge voltage VBLPL to the bit line sense-amplifier 910 through the first and second power nodes RTO and SB.

During the time section between time points T1 and T2, the bit line equalization signal BLEQ may be disabled. Therefore, the first and second bit lines BLT and BLB may be decoupled from each other. The second precharge control signal BISO may be disabled, and thus the third precharge unit 950 may decouple the first input node A and the gate of the second NMOS transistor N2 from each other and may decouple the second input node B and the gate of the first NMOS transistor N1 from each other. Also, the precharge voltage selection signal BLPC may be enabled. Therefore, the second precharge unit 940 may provide the second precharge voltage VBLPH to the gates of the first and second NMOS transistors N1 and N2. The sense-amplifier power control unit 930 may provide the internal voltage VINT to the bit line sense-amplifier 910 through the second power node SB.

During the time section between time points T2 and T3, the first bit line BLT and the second bit line BLB may be precharged. Since the second power node SB of the bit line sense-amplifier 910 may have the voltage level of the internal voltage VINT and the second precharge voltage VBLPH may be applied to the gate of the first and second NMOS transistors N1 and N2, the voltage level of the first bit line BLT may be the second precharge voltage VBLPH minus a threshold voltage VthN1 of the first NMOS transistor (VBLPH−VthN1). Similarly, the voltage level of the second bit line BLB may be the second precharge voltage VBLPH minus a threshold voltage VthN2 of the second NMOS transistor N2 (VBLPH−VthN2).

During the time section between time points T3 and T4, the precharge voltage selection signal BLPC may be disabled and a particular word line WL may be activated. The sense-amplifier power control unit 930 may provide the first precharge voltage VBLPL to the bit line sense-amplifier 910 through the second power node SB.

During the time section between time points T4 and T5, there may be the charge sharing between the first bit line BLT and a memory cell selected by the activated word line WL.

During time section between time points T5 and T6, the first precharge control signal BLPC may be disabled while the second precharge control signal BISO may be enabled. Therefore, the gates of the first and second NMOS transistors N1 and N2 may be decoupled from each other, the first input node A and the gate of the second NMOS transistor N2 may be coupled to each other, and the second input node B and the gate of the first NMOS transistor N1 may be coupled to each other.

At time point T6, the sense-amplifier power control unit 930 may provide the ground voltage VSS to the bit line sense-amplifier 910 through the second power node SB and may provide the internal voltage VINT to the bit line sense-amplifier 910 through the first power node RTO. Therefore, the bit line sense-amplifier 910 may be activated. The bit line sense-amplifier 910 may sense and amplify the voltage levels of the first and second bit lines BLT and BLB. A driving current of a transistor may be proportional to difference (Vgs−Vth) between a threshold voltage and voltage between a gate and a source of the transistor. During the amplifying operation of the bit line sense-amplifier 910, the difference (Vgs−Vth) between the threshold voltage and voltage between the gate and the source of the first NMOS transistor N1 may be the voltage level, which is set through the precharge operation, minus the threshold voltage VthN2 of the second NMOS transistor N2 (VBLPH+VCS−(VthN1+VthN2) where VCS, represents the increased voltage level through the charge sharing) while the difference (Vgs−Vth) between the threshold voltage and voltage between the gate and the source of the second NMOS transit N2 may be the voltage level, which is set through the precharge operation, minus the threshold voltage VthN1 of the first NMOS transistor N1 (VBLPH−(VthN1+VthN2)).

Therefore, when the bit line sense-amplifier 910 is activated, currents flowing through the first and second NMOS transistors N1 and N2 may be substantially the same as each other. As a result, even when the first and second NMOS transistors N1 and N2 have different process skews or offsets from each other, the mismatch may be compensated due to the precharge operation in accordance with an embodiment of the present disclosure.

While certain embodiments have been described above, it will be understood to those skilled in the art that the embodiments described are by way of example only. Accordingly, the bit line sense-amplifier and semiconductor memory apparatus using the same should not be limited based on the described embodiments. Rather, the bit line sense-amplifier and semiconductor memory apparatus using the same described herein should only be limited in light of the claims that follow when taken in conjunction with the above description and accompanying drawings.

What is claimed is:

1. A memory apparatus comprising:
a bit line sense-amplifier coupled to first and second bit lines;
a first precharge unit suitable for coupling the first and second bit lines in response to a bit line equalization signal;
a sense-amplifier power control unit suitable for providing a plurality of powers to the bit line sense-amplifier in response to a power control signal;
a second precharge unit suitable for providing a first precharge voltage to the first and second bit lines in response to the bit line equalization signal; and
a third precharge unit suitable for individually changing each voltage level of the first and second bit lines by providing a second precharge voltage to the first bit line in response to a first bit line precharge control signal, and to the second bit line in response to a second bit line precharge control signal, wherein the first bit line precharge control signal is enabled at different timing from the second bit line precharge control signal.

2. The memory apparatus of claim 1,
wherein the bit line sense-amplifier includes first and second power nodes,
wherein the power control signal includes first and second power control signals, and
wherein the sense-amplifier power control unit provides one of either an internal voltage or a first precharge voltage to the second power node in response to the first power control signal, and provides a ground voltage to the second power node in response to the second power control signal.

3. The memory apparatus of claim 2, wherein the sense-amplifier power control unit provides one of either the internal voltage or the first precharge voltage to the first power node in response to the second power control signal.

4. The memory apparatus of claim 2, wherein the sense-amplifier power control unit provides the first precharge voltage to the second power node in response to the bit line equalization signal.

5. The memory apparatus of claim 1, wherein the second precharge voltage is higher than the first precharge voltage.

6. The memory apparatus of claim 1, further comprising:
a first bit line coupling unit suitable for selectively coupling the bit line sense-amplifier and the first bit line in response to a first bit line isolation signal; and
a second bit line coupling unit suitable for selectively coupling the bit line sense-amplifier and the second bit line in response to a second bit line isolation signal.

* * * * *